(12) United States Patent
Selivanov (10) Patent No.: US 9,256,503 B2
(45) Date of Patent: Feb. 9, 2016

(54) DATA VERIFICATION

(71) Applicant: Ivan Selivanov, Santa Clara, CA (US)

(72) Inventor: Ivan Selivanov, Santa Clara, CA (US)

(73) Assignee: LOAD DYNAMIX, INC., Santa Clara, CA (US)

( * ) Notice: Subject to any disclaimer, the term of this patent is extended or adjusted under 35 U.S.C. 154(b) by 117 days.

(21) Appl. No.: 14/075,969

(22) Filed: Nov. 8, 2013

(65) Prior Publication Data

US 2014/0136897 A1    May 15, 2014

Related U.S. Application Data (60) Provisional application No. 61/725,996, filed on Nov. 13, 2012.

(51) Int. Cl.
 *G06F 11/00* (2006.01)
 *G06F 11/263* (2006.01)
 *G01R 31/3181* (2006.01)

(52) U.S. Cl.
 CPC ........ *G06F 11/263* (2013.01); *G01R 31/31813* (2013.01)

(58) Field of Classification Search
 None
 See application file for complete search history.

(56) References Cited

U.S. PATENT DOCUMENTS

| | | | | |
|---|---|---|---|---|
| 6,678,739 | B1 * | 1/2004 | Muraoka | 709/247 |
| 7,225,373 | B1 * | 5/2007 | Edwards et al. | 714/725 |
| 2004/0255215 | A1 * | 12/2004 | Hildebrant et al. | 714/742 |
| 2013/0339315 | A1 * | 12/2013 | Stoakes et al. | 707/692 |

* cited by examiner

*Primary Examiner* — Daniel McMahon
(74) *Attorney, Agent, or Firm* — Lowenstein Sandler LLP (57) ABSTRACT

A data verification application receives a test configuration data, the test configuration data comprising a seed value and a parameter. The data verification application generates a pseudo-random test data stream comprising a plurality of words, wherein a value of each of the plurality of words is based on the seed value, the parameter and an offset of each word within the pseudo-random test data stream.

27 Claims, 8 Drawing Sheets

DATA VERIFICATION

RELATED APPLICATIONS

This application is related to and claims the benefit of U.S. Provisional Patent Application No. 61/725,996, filed Nov. 13, 2012, the contents of which are hereby incorporated by reference herein.

TECHNICAL FIELD

This disclosure relates to the field of data verification and, in particular, to generating a test data stream that is verifiable and repeatable.

BACKGROUND

Recent expansion of data centers and cloud computing has triggered fast growth of storage area network (SAN) servers, network attached storage (NAS) servers and unified storage data servers, which combine both SAN and NAS. The typical consumers of computation resources in a data center are application servers, virtual machines, virtual machine hypervisors (e.g., ESXi, Hyper-V, Xen), etc. These devices typically utilize network storage servers over internet protocol (IP), for NAS, and/or over Fiber Channel, for SAN. In relation to the network storage servers these software products act as network storage clients.

Some of the features that network storage servers implement are deduplication, compression, caching and tiering. Deduplication and compression are directed to saving physical storage space, whereas caching and tiering seek to improve access time to the data. Compression is generally applicable to a single file or a data stream. Compression algorithms reduce the size of the data by finding and encoding repeating patterns. Some examples of compression algorithms used by file servers include LZ, LZW and LZR lossless compression algorithms. The degree of data compressibility can vary in a range from almost zero (i.e., fully compressible) to almost one (i.e., incompressible).

Examples of incompressible data types include archive files, movies, pictures, encrypted files, etc. Highly compressible data files are those containing large regions of equal bits, such as bitmaps. Bitmap files can show compressibility of approximately 0.02, which is equivalent to a compressed file being 50 times smaller in size compared to the original bitmap file. The degree to which the data can be compressed depends on the chosen algorithm and trade-offs, such as compression time versus compression efficiency.

Deduplication refers to a set of algorithms that find repeating chunks of data both within a file and across multiple files. In a particular case of a file stored under different names, the deduplication algorithm is able to recognize the identity of these files and use the physical storage space for one copy only. Note that a compressible file or a set of compressible files can be not deduplicable (e.g., if all the data is unique) whereas incompressible files, blocks, or other storage objects having the same content can be deduplicable.

Caching and tiering refer to the ability of the servers to determine sections of data that are accessed most often and place them in the data store or memory providing the fastest access. These features are used not only in storage servers but also in wide-area network (WAN) optimization. WAN optimization is a collection of techniques for increasing data-transfer efficiencies across wide-area networks. Among the techniques used are compression, deduplication, caching and tiering.

Implementation of the above described features is a complicated task and, therefore, requires extensive validation and benchmarking. Conventional tools used for testing network storage servers, however, typically do not provide data validation. Alternatively, these tools may verify the data corrupted in transit between a storage client and a storage server, but cannot identify the data erroneously provided by the storage server.

BRIEF DESCRIPTION OF THE DRAWINGS

The present disclosure is illustrated by way of example, and not by way of limitation, in the figures of the accompanying drawings.

DETAILED DESCRIPTION

Embodiments are described for data verification. In one embodiment, a data verification application receives test configuration data, which can include a seed value and at least one parameter, from which a pseudo-random test data stream can be generated. The seed value may be, for example, a 64-bit random number. The parameter can include a compressibility value which controls a relative compressibility of the resulting pseudo-random test data stream. Depending on the embodiment, the test configuration data can be received from a number of sources, such as input from a user, from computer program application, etc. In response, the data verification application may generate a pseudo-random test data stream according to an algorithm. The pseudo-random test data stream can include a plurality of words (e.g., 64 bits) arranged in chunks (e.g., 1-8 kilobytes), where a value of each of the plurality of words is generated based on the seed value, the compressibility parameter and an offset of each word within the pseudo-random test data stream. The resulting pseudo-random test data stream is verifiable and repeatable. The stream can be recreated at a later point in time or by some other application that has the algorithm and the test configuration data. The stream can also be recreated starting from the offset of any chunk within the stream as long as the seed value and the compressibility parameter are known because the values of the words within a given chunk in the stream are not dependent on the values of the words in any previous chunk. This is in contrast to conventional streams where, in order to recreate the value of a given word in the stream, the system would have to calculate the value of every previous word in the stream since there is a dependency between each word and the previous word in the stream.

The resulting pseudo-random test data stream has a variety of potential applications, including several in the field of data verification. Testing compression and deduplication functionality involve a testing device, running the data verification application, to generate data with varying degrees of compressibility and similarity. In one embodiment, the data can be stored on a storage device, either locally or over a network, and later read and validated. In another embodiment, the generated pseudo-random test data stream can be used to test compression, deduplication and caching applied to local and network storage, as well as WAN optimization devices. In one embodiment, a test system includes a user interface application and a test appliance. The test appliance may represent a computer with network interfaces. The test appliance can run application software which emulates a large number of network storage clients or storage servers generating data targeting devices under test (DUT). The test appliance can also be inserted into an existing system to function itself as a storage server or storage client or be used to test the operation standalone storage servers, clients or WAN optimization devices.

The testing performed by the test appliance may include an emulated storage client writing data to the storage server, reading it back and validating that the data read is exactly the data written previously. In one embodiment, the testing is configured with the following features. The data can be written by multiple clients to different locations simultaneously. This creates stress on the device under test under which the performance can be measured. The data can also be read by multiple clients simultaneously from the same or different locations. There is no time limitation for a period between writing and reading the data. This allows for off-line deduplication, compression, caching and tiering. The amount of data written by the storage client, read by the storage client and validated by the storage client is limited only by the server capacity. Thus, there is no need for additional storage on the test appliance emulating clients. The data can be validated in real time, as it being received, without being stored for post-processing. The data can be regenerated as unique or identical to the previously created data. The generated data has variable degree of compressibility attributable to the compressibility parameter. The incompressible data can be combined in a test with compressible data. In addition, a data stream can be uniquely identified by a Data ID, also referred as the seed value (e.g., an unsigned integer number).

Figure 1:
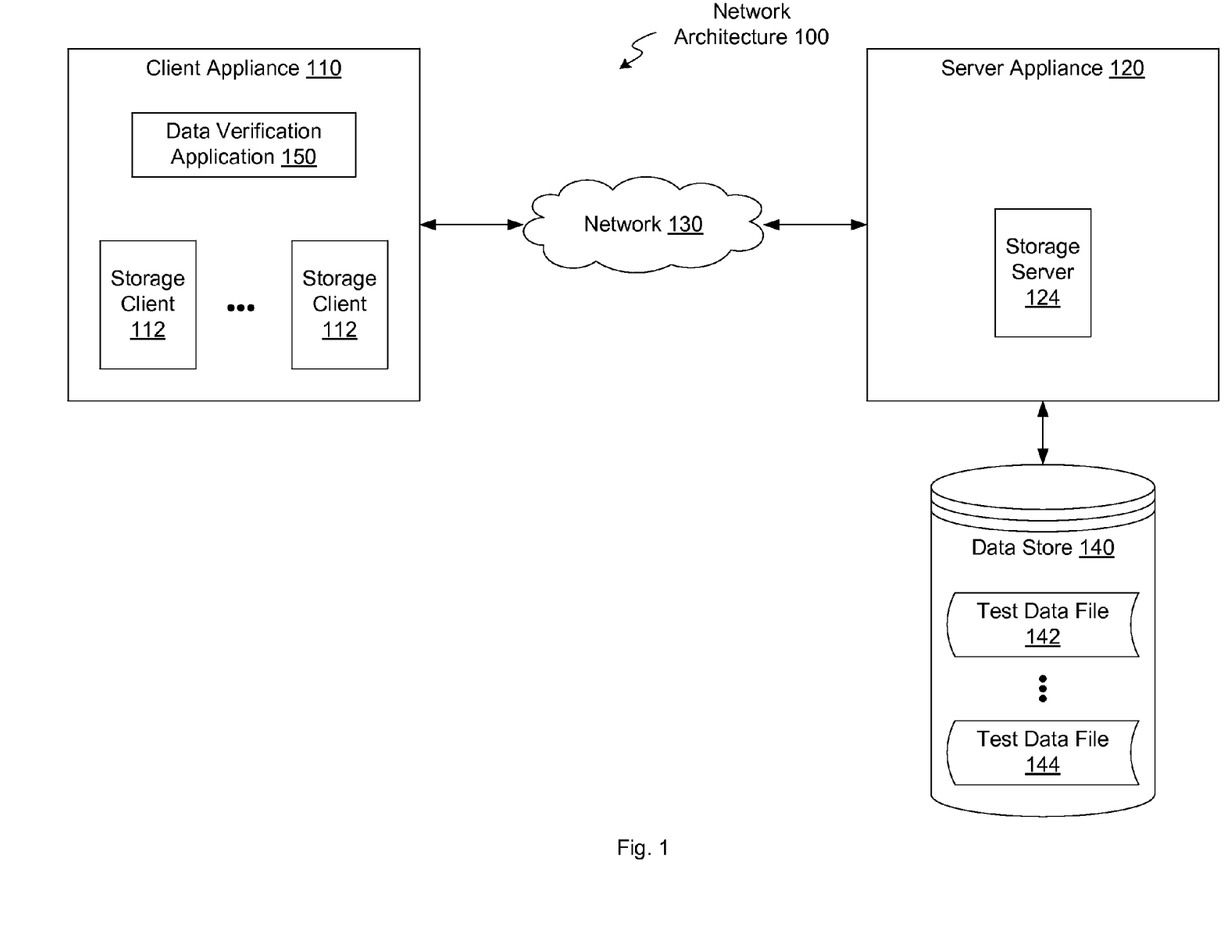
FIG. 1 is a block diagram illustrating an exemplary network architecture in which embodiments of the present disclosure may be implemented.

FIG. 1 is a block diagram illustrating an exemplary network architecture 100 in which embodiments of the present disclosure may be implemented. In one embodiment, the network architecture 100 includes client appliance 110 and server appliance 120, connected by a network 130. In one embodiment, network 130 may include a public network (e.g., the Internet), a private network (e.g., a local area network (LAN) or wide area network (WAN)), a wired network (e.g., Ethernet network), a wireless network (e.g., an 802.11 network or a Wi-Fi network), a cellular network (e.g., a Long Term Evolution (LTE) network), routers, hubs, switches, server computers, and/or a combination thereof. In one embodiment, server appliance 120 may include a connected data store 140. Data store 140 may be a memory (e.g., random access memory), a cache, a drive (e.g., a hard drive), a flash drive, a database system, or another type of component or device capable of storing data. Data store 140 may also include multiple storage components (e.g., multiple drives or multiple databases) that may also span multiple computing devices (e.g., multiple server computers).

Client appliance 110 may include a computing device such as a server, personal computer (PC), laptop, mobile phone, smart phone, tablet computer, netbook computer, etc. Client appliance 110 includes data verification application 150 and one or more storage clients 112. In one embodiment, storage clients 112 may be virtual machines running on client appliance 110 and are designed to generate and issue storage access requests to a storage server 124 running on server appliance 120. Data verification application 150 may include an interface to allow communication with a user and/or with other computer application programs running on client appliance 110 or accessible over network 130. Through this interface, data verification application 150 may receive test configuration data, including a seed value and a compressibility parameter, for use in generating a pseudo-random test data stream. Data verification application 150 may generate the pseudo-random test data stream as described below, and instruct storage clients 112 to write at least a portion of the test data stream to storage server 124 running on server appliance 120.

In one embodiment, storage server 124 may store the received portion of the test data stream on data store 140 (e.g., as test data file 142 or 144). As part of a test scenario, data verification application 150 may instruct storage clients 112 to issue a read request to storage server 124 for the previously written test data file 142. Storage server 124 may transmit the requested test data file 142 back to the storage client 112 on client appliance 110 over network 130. In one embodiment, data verification application 150 recreates the pseudo-random test data stream using the seed value and compressibility parameter from the previously received test configuration data, as well as the offset of a given word within the stream. Data verification application 150 may compare the recreated pseudo-random test data stream to the received test data file 142 to verify a contents of the test data file. This verification can include a determination that the contents of the test data file 142 were not corrupted or otherwise altered during the transfer across network 130 or during the process of storing and retrieving the test data file 142 on data store 140. In one embodiment, data verification application 150 may generate a verification report based on the result of the comparison and provide the report to a requestor. Additional details of data verification application 150 are provided below.

Figure 2:
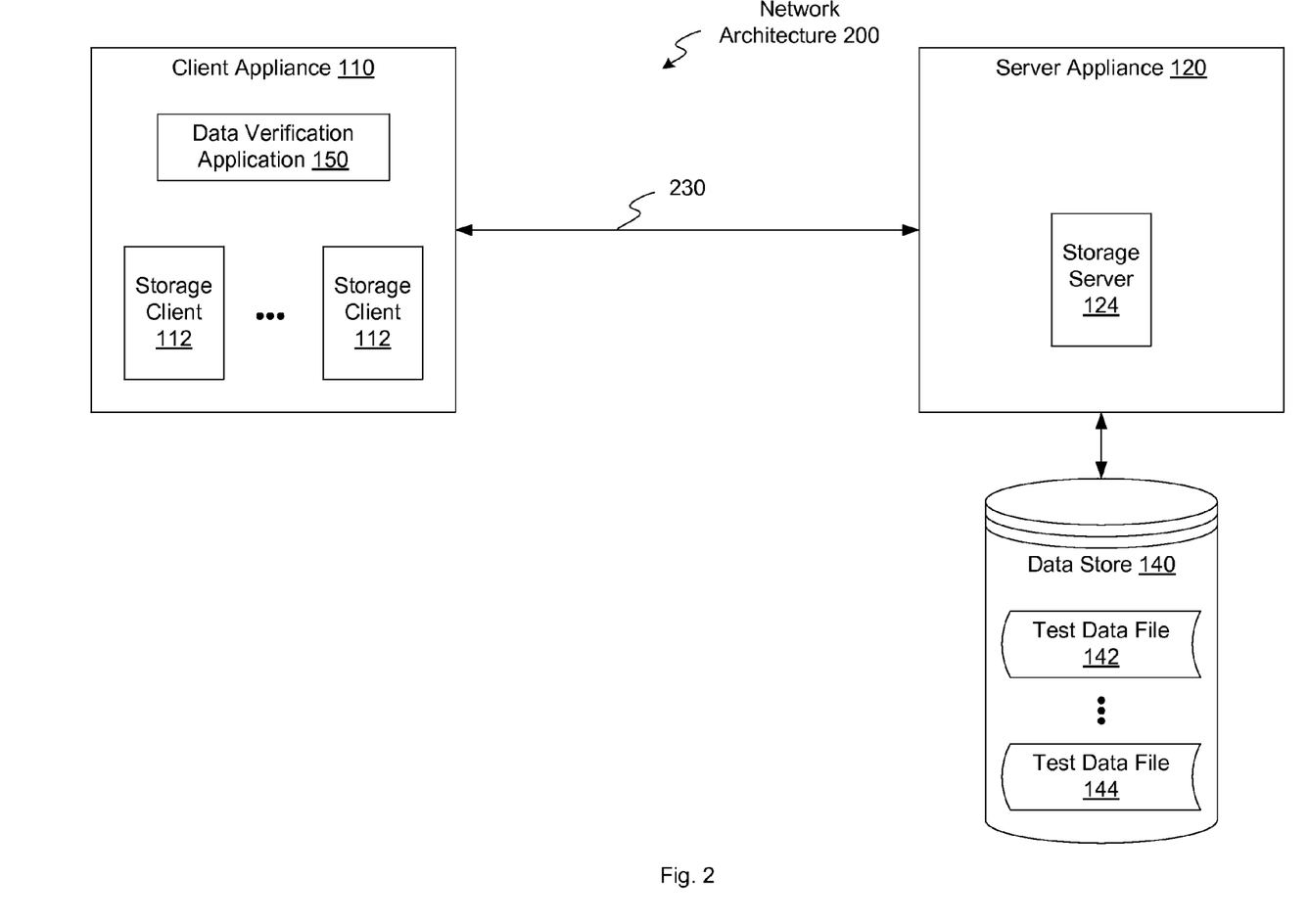
FIG. 2 is a block diagram illustrating a second network architecture in which embodiments of the present disclosure may be implemented.

FIG. 2 is a block diagram illustrating an exemplary network architecture 200 in which embodiments of the present disclosure may be implemented. Network architecture 200 may be similar to network architecture 100 discussed above with respect to FIG. 1, except that rather than client appliance 110 and server appliance 120 being connected over a network 130, in network architecture 200, client appliance 110 and server appliance 120 have a direct connection 230. Direct connection 230 may be, for example, a bus. Any of the signals provided over various buses described herein may be time multiplexed with other signals and provided over one or more common buses. Direct connection 230 may alternatively be one or more single signal lines and each of the single signal lines. Network architecture 200 may be designed to perform a data verification to determine whether the contents of a test data file 142 were corrupted or otherwise altered during the process of storing and retrieving the test data file 142 on data store 140 without factoring in the possible corruption attributable to transfer over network 130.

In other embodiments, either in network architecture 100 or 200, one or both of storage clients 112 and storage server 124 may be separate physical computers residing outside client appliance 110 and server appliance 120. In these embodiments, client appliance 110 or server appliance 120 may connected to storage clients 112 and storage server 124, respectively, and may still run data verification application 150. In another embodiment, data verification application 150 may be loaded onto and run directly from one of storage clients 112 and/or storage server 124.

Figure 3:
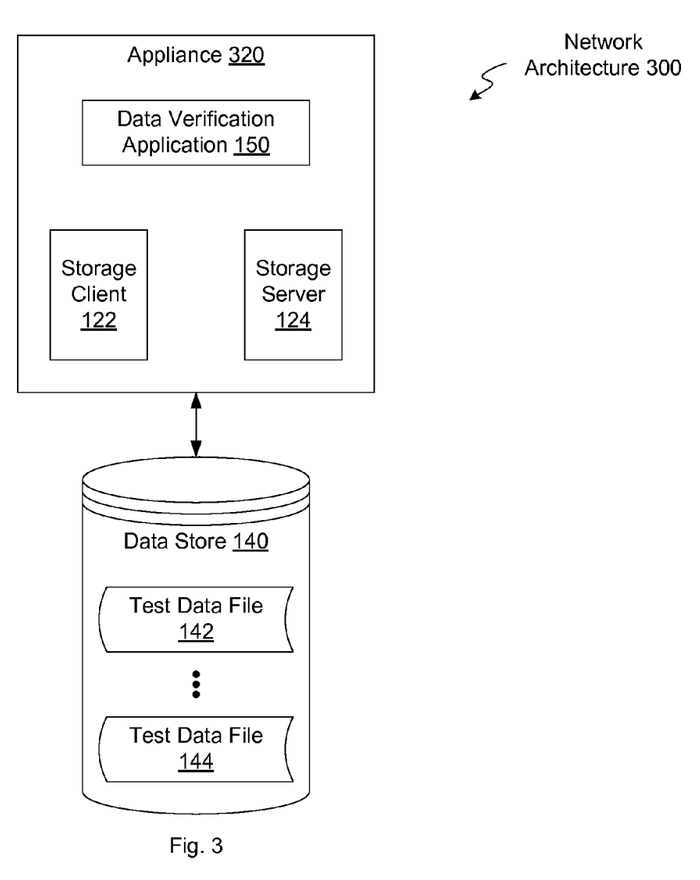
FIG. 3 is a block diagram illustrating a third network architecture in which embodiments of the present disclosure may be implemented.

FIG. 3 is a block diagram illustrating an exemplary network architecture 300 in which embodiments of the present disclosure may be implemented. In one embodiment, network architecture 300 includes a single appliance 320. Appliance 320 may be one of either client appliance 110 or server appliance 120, or may be a different appliance. In one embodiment, appliance 320 includes as least one storage client 122 and at least one storage server 124. As described above, storage client 122 and storage server 124 may be virtual machines designed to emulate the operation of a separate physical client and server. Appliance 320 may additionally include data verification application 150.

In one embodiment, data verification application 150 generates the pseudo-random test data stream and instructs storage client 122 to write at least a portion of the test data stream to storage server 124. Storage server 124 may store the portion of the test data stream on data store 140 (e.g., as test data file 142 or 144). As part of a test scenario, data verification application 150 may instruct storage server 124 to read the previously written test data file 142 from data store 140. In one embodiment, data verification application 150 recreates the pseudo-random test data stream using the seed value and compressibility parameter from the previously received test configuration data, as well as the offset of a given word within the stream. Data verification application 150 may compare the recreated pseudo-random test data stream to the read test data file 142 to verify a contents of the test data file. This verification can include a determination that the contents of the test data file 142 were not corrupted or otherwise altered during the process of storing and retrieving the test data file 142 on data store 140.

Figure 4:
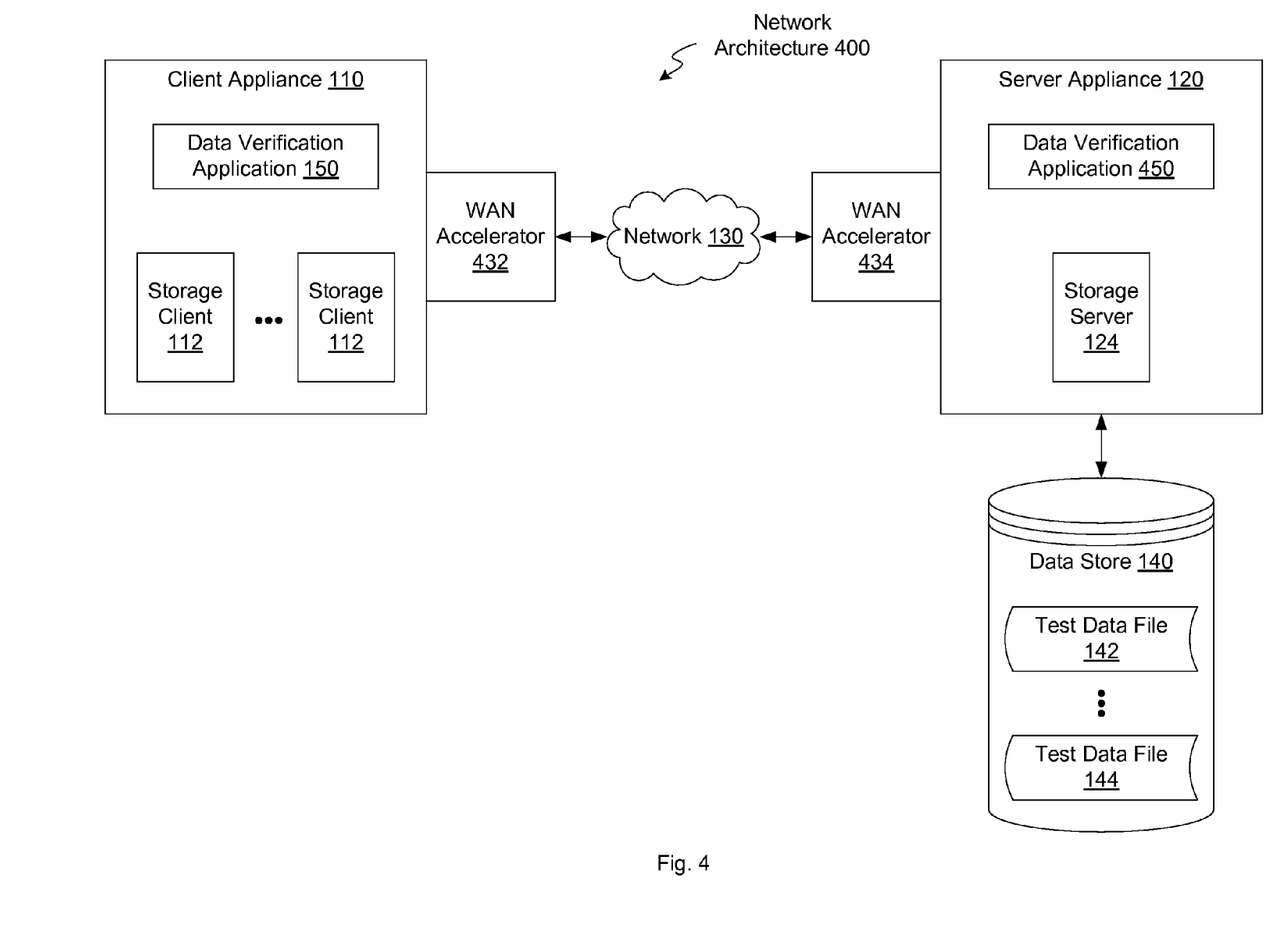
FIG. 4 is a block diagram illustrating a fourth network architecture in which embodiments of the present disclosure may be implemented.

FIG. 4 is a block diagram illustrating an exemplary network architecture 400 in which embodiments of the present disclosure may be implemented. Network architecture 400 may be similar to network architecture 100 discussed above with respect to FIG. 1, except that in this embodiment, network 130 additionally includes WAN accelerators 432, 434. In one embodiment, WAN accelerators 432, 434 may be part of a data-transfer efficiency system designed to increase data-transfer efficiencies across network 130. Among the techniques that may be used by the data-transfer efficiency system are compression, deduplication, caching and tiering. In one embodiment, WAN accelerators 432, 434 may be part of network 130. In another embodiment, WAN accelerators 432, 434 may be part of client appliance 110 and server appliance 120, respectively. In yet another embodiment, WAN accelerators 432, 434 may separate physical components to which one or both of client appliance 110 and server appliance 120 are connected.

In one embodiment, as read and write requests for the pseudo-random test data are sent between storage clients 112 and storage server 124 across network 130, WAN accelerators 432, 434 perform data-transfer efficiency operations, including for example, compression, deduplication, caching, tiering and/or other operations designed to reduce the bandwidth of network 130 that is utilized and to decrease data transfer operation times. In one embodiment, storage server 124 stores the portion of the pseudo-random test data stream in data store 140 as test data file 142, 144 and returns a copy of test data file 142, 144 to client appliance 110 where one copy of data verification application 150 can perform the data verification. In another embodiment, storage server 124 receives the portion of the pseudo-random test data stream and a copy of the data verification application 450 running on server appliance 120 can recreate the test data stream and perform the data verification, as mentioned above and as will be described in more detail below.

Figure 5:
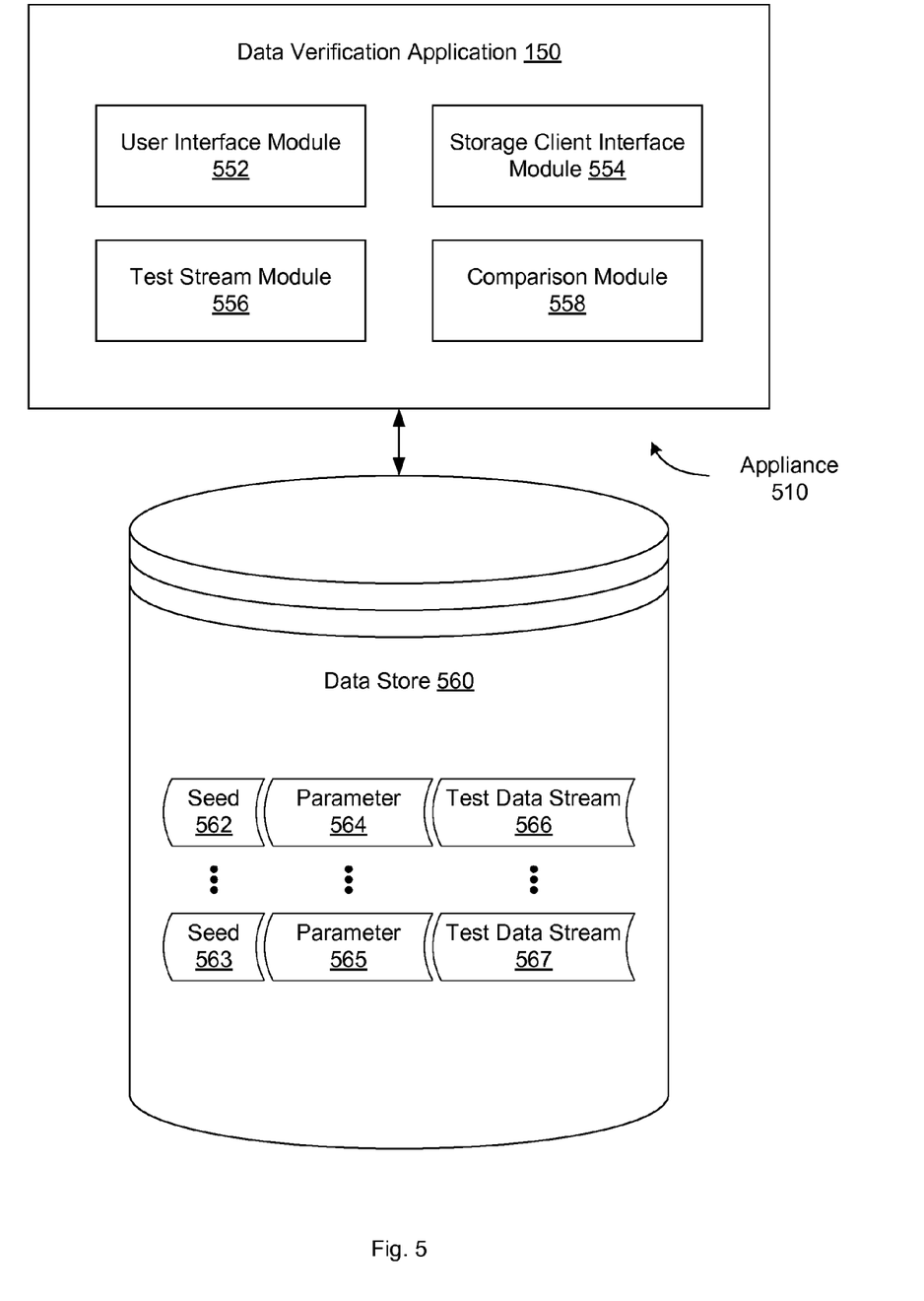
FIG. 5 is a block diagram illustrating a data verification application, according to an embodiment.

FIG. 5 is a block diagram illustrating a data verification application, according to an embodiment. In one embodiment, data verification application 150 includes user interface module 552, storage client interface module 554, test stream module 556 and comparison module 558. This arrangement of modules and components may be a logical separation, and in other embodiments, these modules or other components can be combined together or separated in further components, according to a particular embodiment. In one embodiment, data store 560 is connected to appliance 510 and includes content items seeds 562, 563, parameters 564, 565 and pseudo-random test data streams 566, 567. In one embodiment, appliance 510, which may be representative of client appliance 110, server appliance 120, appliance 320, or some other appliance, may include both data verification application 150 and data store 560. In another embodiment, data store 560 may be external to appliance 510 and may be connected to appliance 510 over a network or other connection. In other embodiments, appliance 510 may include different and/or additional components which are not shown to simplify the description. Data store 560 may include one or more mass storage devices which can include, for example, flash memory, magnetic or optical disks, or tape drives; read-only memory (ROM); random-access memory (RAM); erasable programmable memory (e.g., EPROM and EEPROM); flash memory; or any other type of storage medium.

In one embodiment, user interface module 552 allows communication with a user and/or with other computer application programs running on appliance 510 or accessible over a network. User interface module 552 may receive test configuration data, including a seed value 562, 563 and a compressibility parameter 564, 565, for use in generating a pseudo-random test data stream 566, 567. The seed value 562, 563 may be, for example, a 64-bit random number, a 64-bit unsigned integer, or some other value of some other length. The parameter 564, 565 can include a compressibility value which controls a relative compressibility of the resulting pseudo-random test data stream 566, 567. In other embodiments, the received test configuration data may include other data, such as additional parameters, including for example, a deduplication parameter to control a relative deduplicability of the test data stream, a length parameter to control the length of the test data stream, or other data. In one embodiment, user interface module 552 stores the configuration data including seed value 562, 563 and compressibility parameter 564, 565 in data store 560.

In one embodiment, storage client interface module 554 generates and controls the operation of one or more storage clients 112 on appliance 510. In one embodiment, storage clients 112 may be virtual machines running on appliance 510 and are designed to generate and issue storage access requests to a storage server 124 running on server appliance 120. In one embodiment, storage client interface module 554 generates or initializes a number of storage clients 112 according to a load specified in the configuration data received by user interface module 552. Storage client interface module 554 may instruct the storage clients 112 to write at least a portion of a pseudo-random test data stream 566 to a storage server 124 running on the same or a different appliance, and to read the previously written test data stream from the storage server 124. In other embodiments, the storage clients 112 may reside outside appliance 510, however, storage client interface module 554 can still provide instructions pertaining to the reading and writing of the test data stream.

In one embodiment, test stream module 556 generates a pseudo-random test data stream 566 including a series of words (e.g., 64 bit data segments), where the value of each word is calculated based on the seed value 562, the compressibility parameter 564, and an offset of the word within the pseudo-random test data stream 566. Test stream module 556 may utilize a data generation algorithm to generate a random sequence of bytes based on the data offset and the seed value 562 in such a way that the value of the generated byte is fully determined by its count from the initial offset, the seed value 562, and the compressibility parameter 564. Although the algorithm can work with integers of any size, in one embodiment, the integer size matches the processor architecture (e.g., 32-bit or 64-bit) in order to achieve optimal performance.

The algorithm generates pseudo-random test data stream 566 as chunks of M bytes, with a typical value of M being in the range of 512 bytes to 8 kilobytes. Further, each chunk may be broken down into words of the same size as the seed value 562 (e.g., 64 bits). In one embodiment, the words within the chunk, starting at an offset equal to M*Chunk_Number, are generated sequentially as follows:

```
If the Word is the first in the chunk then
    Word := Data_ID xor Chunk_Number
    If Word is 0
        PreviousWord := default non-zero value
    Else
        PreviousWord := Word
Elseif last bit of the PreviousWord equals 1 then
    Word := (PreviousWord rshift 1) xor P
    PreviousWord := Word
    Word := Word xor Word_Offset
Else
    Word := (PreviousWord rshift 1)
    PreviousWord := Word
    Word := Word xor Word_Offset
```

In one embodiment, the value P represents the compressibility parameter 564, the Word_Offset is the offset in bytes from the beginning of the test data stream 566, and Chunk_Number is a sequentially increasing integer representing the order of chunks in the test data stream 566. The offset of a given chunk, measured in bytes, can be calculated as the chunk size M multiplied by the Chunk_Number. The value of P may determine the relative compressibility of the generated data stream. One possible implementation is to choose the value of P as a value corresponding to the taps for a Maximum-Length LFSR Counter in order to achieve incompressible random data. Additional details of the algorithm utilized by test stream module 556 are described below with respect to FIG. 7. In another embodiment, the algorithm can generate data in sizes other than the word described above. For example, the algorithm could generate word and test stream module 556 could use only the most significant bit of the word in the test data stream 566. In another embodiment, the algorithm may output a single byte, multiple bytes, or some other sized piece of data, rather than an entire word (i.e., 8 bytes). In other embodiments, test stream module 556 may use some other algorithm to generate test data stream 566.

In one embodiment, comparison module 558 may compare a recreated pseudo-random test data stream 566 to a received test data file read from the storage server or received from the storage client to verify a contents of the test data file. This verification can include a determination that the contents of the test data file were not corrupted or otherwise altered during the transfer across a network or during the process of storing and retrieving the test data file on a data store. In one embodiment, comparison module 558 may perform a bitwise or bytewise comparison of the two versions of the test data stream 566. In other embodiments, comparison module 558 may use fingerprinting, parity bits, checksums, or other error detection methods to perform the comparison and identify potential differences. In one embodiment, comparison module 558 may generate a verification report based on the result of the comparison and provide the report to a requestor.

Figure 6:
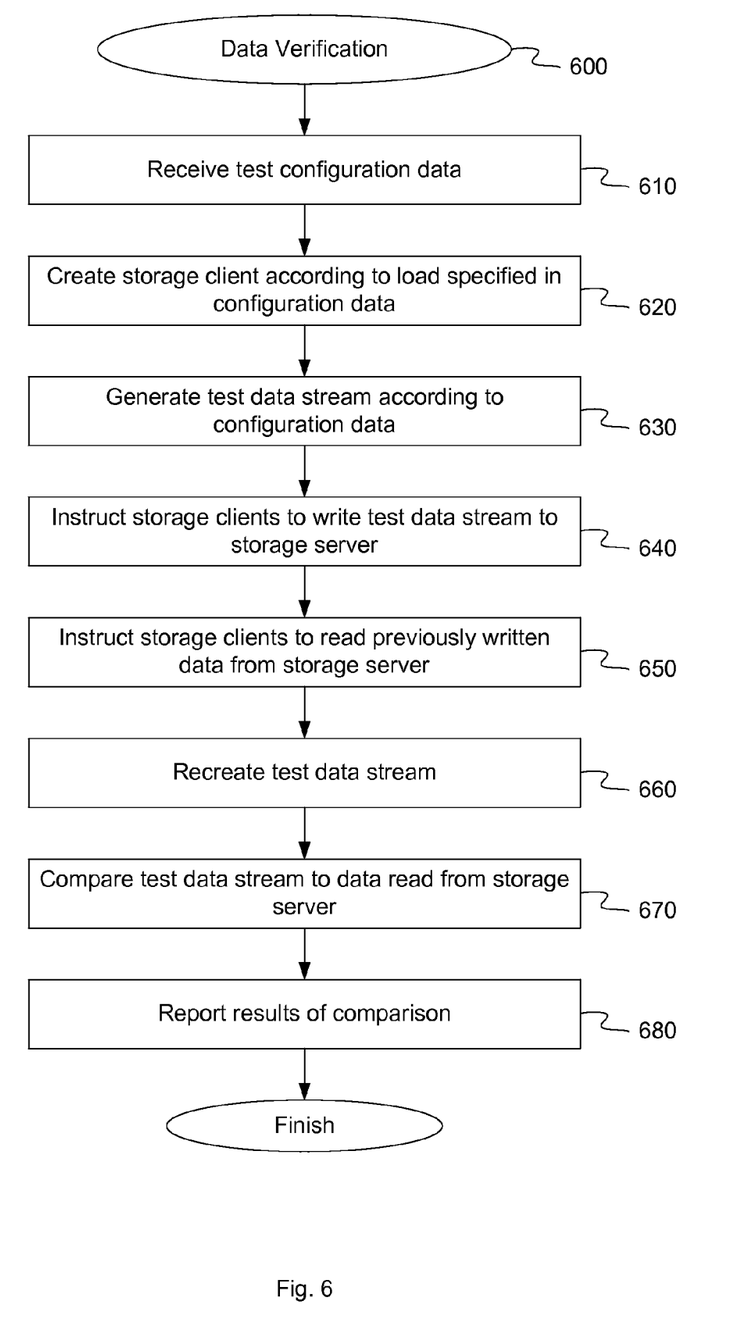
FIG. 6 is a flow diagram illustrating a method for data verification, according to an embodiment.

FIG. 6 is a flow diagram illustrating a data verification method, according to some embodiments. The method 600 may be performed by processing logic that comprises hardware (e.g., circuitry, dedicated logic, programmable logic, microcode, etc.), software (e.g., instructions run on a processing device to perform hardware simulation), or a combination thereof. The method 600 utilizes a generated pseudo-random test data stream to test the operation of a local storage system, a network storage system, or a data-transfer efficiency system. In one embodiment, method 600 may be performed by data verification application, as shown in FIGS. 1-5.

Referring to FIG. 6, at block 610, method 600 receives test configuration data. In one embodiment, user interface module 552 receives test configuration data, including a seed value 562 and a compressibility parameter 564, for use in generating a pseudo-random test data stream 566. The seed value 562 may be, for example, a 64-bit random number, a 64-bit unsigned integer, or some other value of some other length. The parameter 564 can include a compressibility value which controls a relative compressibility of the resulting pseudo-random test data stream 566. In one embodiment, user interface module 552 stores the configuration data in data store 560.

At block 620, method 600 creates one or more storage clients according to a load specified in the test configuration data. In one embodiment, storage client interface module 554 generates and controls the operation of one or more storage clients on the appliance. In one embodiment, the storage clients may be virtual machines running on the appliance and are designed to emulate the behavior of standalone storage clients to generate and issue storage access requests to the storage server running on a server appliance. In one embodiment, storage client interface module 554 generates or initializes a number of storage clients according to a load specified in the configuration data received at block 610.

At block 630, method 600 generates a pseudo-random test data stream according to the test configuration data. In one embodiment, test stream module 556-generates a pseudo-random test data stream 566 including a series of words (e.g., 64 bit data segments), where the value of each word is calculated based on the seed value 562, the compressibility parameter 564, and an offset of the word within the pseudo-random test data stream 566. Test stream module 556 may utilize a data generation algorithm to generate a random sequence of bytes based on the data offset and the seed value 562 in such a way that the value of the generated byte is fully determined by its count from the initial offset, the seed value 562, and the compressibility parameter 564. Additional details of the algorithm utilized by test stream module 556 are described below with respect to FIG. 7.

At block 640, method 600 instructs the storage clients to write at least a portion of the pseudo-random test data stream to a storage server. In one embodiment, storage client interface module 554 may instruct the storage clients to write at least a portion of a pseudo-random test data stream 566 to a storage server running on the same or a different appliance.

The pseudo-random test data may be passed via a write operation or via some other operation.

At block 650, method 600 instructs the storage clients to read the previously written data from the storage server. In one embodiment, storage client interface module 554 may instruct the storage clients to read the previously written test data stream (e.g., test data file 142) from the storage server. The pseudo-random test data may be retrieved via a read operation or via some other operation.

At block 660, method 600 recreates the pseudo-random test data stream. In one embodiment, test stream module 556 recreates the pseudo-random test data stream 566 using the same algorithm as was used at block 630. As described above, the pseudo-random test data stream 566 can include a series of words, where the value of each word is calculated based on the seed value 562, the compressibility parameter 564, and the offset of the word within the pseudo-random test data stream 566.

At block 670, method 600 compares the recreated test data stream to data read from the storage server. In one embodiment, comparison module 558 compares pseudo-random test data stream 566 recreated at block 660 to the received test data file read from the storage server or received from the storage client at block 650 to verify a contents of the test data file. This verification can include a determination that the contents of the test data file were not corrupted or otherwise altered during the transfer across a network or during the process of storing and retrieving the test data file on a data store.

At block 680, method 600 reports the results of the comparison to a requestor. In one embodiment, comparison module 558 may generate a verification report based on the result of the comparison performed at block 670 and provide the report to a requestor (e.g., a user, system administrator, another computer application program).

Figure 7:
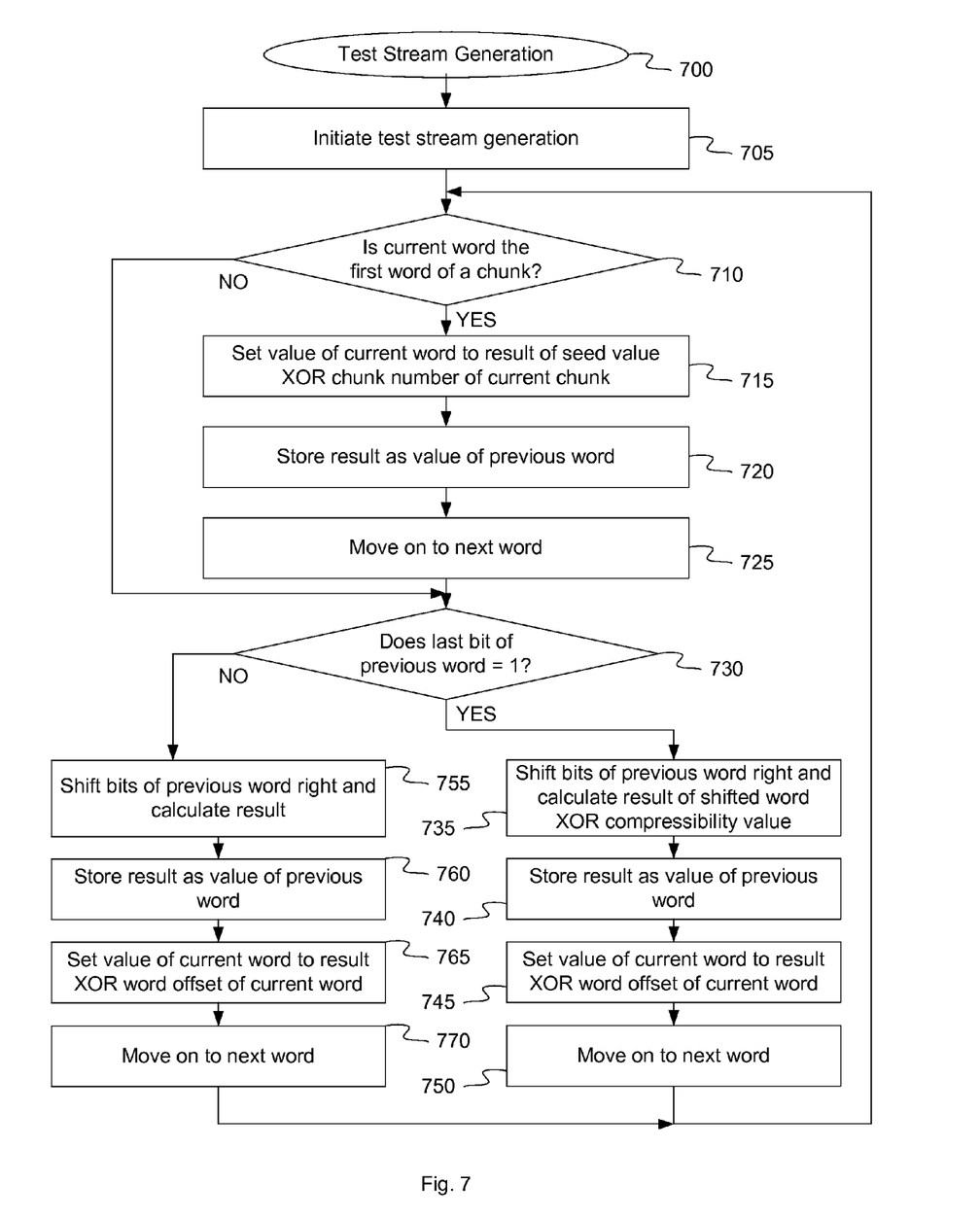
FIG. 7 is a flow diagram illustrating a method for test data stream generation, according to an embodiment.

FIG. 7 is a flow diagram illustrating a method for pseudo-random test data stream generation, according to some embodiments. The method 700 may be performed by processing logic that comprises hardware (e.g., circuitry, dedicated logic, programmable logic, microcode, etc.), software (e.g., instructions run on a processing device to perform hardware simulation), or a combination thereof. The method 700 generates a pseudo-random test data stream made up of a plurality of words, wherein a value of each word is calculated based on a seed value, a compressibility parameter, and an offset of the word within the pseudo-random test data stream. The operations of method 700 are repeated for each chunk in the pseudo-random test data stream and for each word within each chunk. In one embodiment, method 700 may be performed by data verification application, as shown in FIGS. 1-5.

Referring to FIG. 7, at block 705, method 700 initiates the pseudo-random test data stream generation. Generation of the test data stream may be initiated based on receipt of test configuration data, at the request of a user, administrator, another application, or as a result of some other occurrence.

At block 710, method 700 determines whether the current word being generated is the first word of a chunk. In one embodiment, the pseudo-random test data stream includes a series of words of a fixed size. Although the algorithm can work with integers of any size greater than 2 bits, in practice the integers may be at least one byte in size. In one embodiment, the size of each word matches the processor architecture (e.g., 64-bits) in order to achieve optimal pert tam y. The words may be arranged in chunks of M bytes, with a typical value of M being in the range of 512 bytes to 8 kilobytes. In one embodiment, test stream module 556 includes a counter that increments each time a new word is generated. The value of the counter can be multiplied by the word size to determine the current offset of the word (i.e., Word_Offset). To determine whether the current word is the first word of a chunk, test stream module 556 can divide the Word_Offset by the chunk size M and determine if there is any remainder (e.g., using a modulo operation). The remainder will be zero if the current word is the first word of a chunk, otherwise there will be some non-zero remainder.

If the current word being generated is the first word of a chunk, at block 715, method 700 sets the value of the current word to a result of the seed value logically combined (e.g., XOR'd) with a chunk number (i.e., Chunk_Number) of the current chunk. In one embodiment, the seed value is received as part of the test configuration data and may have a same length (e.g., 64 bits) as each word in the pseudo-random test data stream. In one embodiment, the logical combination can be reversed for the first word in each chunk at a later time in order to identify the pseudo-random test data stream based on the seed value.

At block 720, method 700 stores the result of the XOR operation as a value referred to as the "previous word." If the XOR operation results in a zero value, in one embodiment, method 700 sets the value of "previous word" to a default non-zero value. The same default value may be used consistently each time the XOR operation results in a zero value. At block 725, method 700 moves on to generation of a next word in the pseudo-random test data stream.

If the current word being generated is not the first word of a chunk, at block 730, method 700 determines if the last bit of the stored "previous word" value was equal to a logical 1. In other embodiments, at block 730, method 700 may determine if the last bit of the stored "previous word" value was equal to a logical 0. The bit that is checked (i.e., the "last" bit described above) is the bit that will be dropped when the bits are shifted at block 735. This is generally the least significant bit of the word.

If the last bit of the stored "previous word" value was a logical 1 (or logical 0, depending on the embodiment), at block 735, method 700 shifts the bits of the previous word to the right and calculates a result of the shifted word logically combined (e.g., XOR'd, OR'd, AND'd) with the value of a compressibility parameter. In one embodiment, the least significant bit is dropped from the value and a default bit (e.g. a logical 0) is added in the most significant bit position to form the shifted word. At block 740, method 700 stores the result of the XOR operation as the value referred to as the "previous word."

At block 745, method 700 sets the value of the current word to the result of the XOR operation at block 735 logically combined (e.g., XOR'd) with a word offset value (i.e., Word_Offset) of the current word within the pseudo-random test data stream. In one embodiment, the operations at blocks 740 and 745 are optionally performed to improve the compressibility of the pseudo-random test data stream. In the absence of blocks 740 and 745, at block 735, the value of the current word may be set to the result of the logical combination. At block 750, method 700 moves on to generation of a next word in the pseudo-random test data stream.

If at block 730, the last bit of the stored "previous word" value was not a logical 1 (or logical 0, depending on the embodiment), at block 755, method 700 shifts the bits of the previous word to the right (or left, depending on the algorithm) and calculates a result. In one embodiment, the least significant bit is dropped from the value and a default bit (e.g. a logical 0) is added in the most significant bit position to form the shifted word. At block 760, method 700 stores the result of the shift as the value referred to as the "previous word."

At block 765, method 700 sets the value of the current word to the result of the shift operation at block 755 logically combined (e.g., XOR'd) with a word offset value of the current word within the pseudo-random test data stream. In one embodiment, the operations at blocks 760 and 765 are optionally performed to improve the compressibility of the pseudo-random test data stream. In the absence of blocks 760 and 765, at block 755, the value of the current word may be set to the result of the shift. At block 770, method 700 moves on to generation of a next word in the pseudo-random test data stream.

In one embodiment, method 700 returns to block 710 and repeats the operations at block 710-770 for each additional word in the pseudo-random test data stream. In one embodiment, data verification application 150 may allow method 700 to continue operation indefinitely. In another embodiment, data verification application 150 may place limits on the length of the pseudo-random test data stream, such as a total data size, a number of words, a number of chunks, or a period of time for which method 700 is allowed to run.

Figure 8:
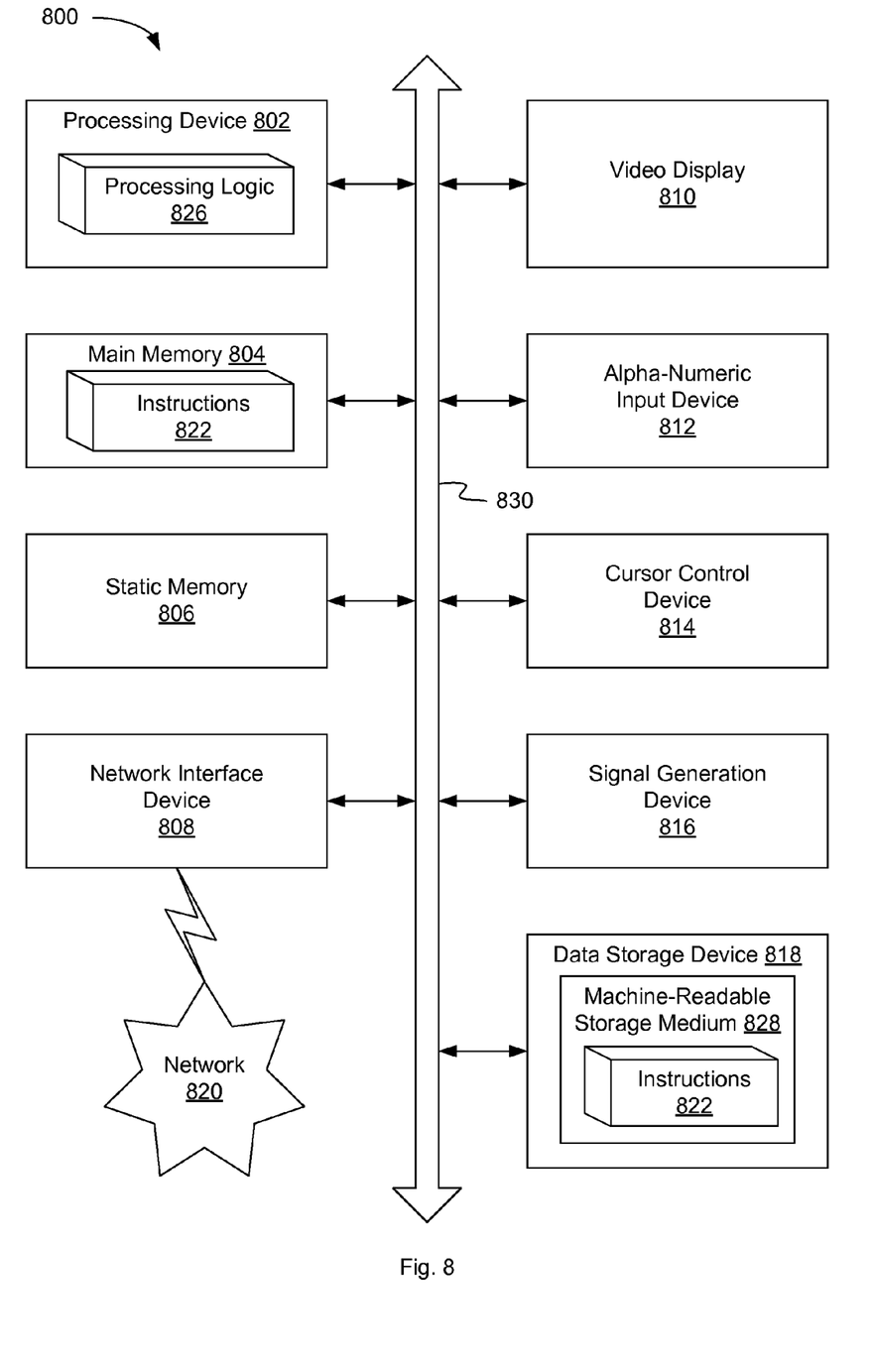
FIG. 8 is a block diagram illustrating an exemplary computer system, according to some embodiments.

FIG. 8 illustrates a diagrammatic representation of a machine in the exemplary form of a computer system 800 within which a set of instructions, for causing the machine to perform any one or more of the methodologies discussed herein, may be executed. In alternative embodiments, the machine may be connected (e.g., networked) to other machines in a local area network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein. In one embodiment, computer system 800 may be representative of client appliance 110, server appliance 120, appliance 320 or appliance 510, running data verification application 150.

The exemplary computer system 800 includes a processing device 802, a main memory 804 (e.g., read-only memory (ROM), flash memory, dynamic random access memory (DRAM) (such as synchronous DRAM (SDRAM) or Rambus DRAM (RDRAM), etc.), a static memory 806 (e.g., flash memory, static random access memory (SRAM), etc.), and a data storage device 818, which communicate with each other via a bus 830. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Processing device 802 represents one or more general-purpose processing devices such as a microprocessor, central processing unit, or the like. More particularly, the processing device may be complex instruction set computing (CISC) microprocessor, reduced instruction set computer (RISC) microprocessor, very long instruction word (VLIW) microprocessor, or processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 is configured to execute processing logic 826 for performing the operations and steps discussed herein.

The computer system 800 may further include a network interface device 808. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), and a signal generation device 816 (e.g., a speaker).

The data storage device 818 may include a machine-readable storage medium 828, on which is stored one or more set of instructions 822 (e.g., software) embodying any one or more of the methodologies of functions described herein. The instructions 822 may also reside, completely or at least partially, within the main memory 804 and/or within the processing device 802 during execution thereof by the computer system 800; the main memory 804 and the processing device 802 also constituting machine-readable storage media. The instructions 822 may further be transmitted or received over a network 820 via the network interface device 808.

The machine-readable storage medium 828 may also be used to store instructions to perform a method for data verification and pseudo-random test data stream generation, as described herein. While the machine-readable storage medium 828 is shown in an exemplary embodiment to be a single medium, the term "machine-readable storage medium" should be taken to include a single medium or multiple media (e.g., a centralized or distributed database, and/or associated caches and servers) that store the one or more sets of instructions. A machine-readable medium includes any mechanism for storing information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; or another type of medium suitable for storing electronic instructions.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular embodiments may vary from these exemplary details and still be contemplated to be within the scope of the present disclosure.

In situations in which the systems discussed herein collect personal information about users, or may make use of personal information, the users may be provided with an opportunity to control whether programs or features collect user information (e.g., information about a user's social network, social actions or activities, profession, a user's preferences, or a user's current location), or to control whether and/or how to receive content from the media server that may be more relevant to the user. In addition, certain data may be treated in one or more ways before it is stored or used, so that personally identifiable information is removed. For example, a user's identity may be treated so that no personally identifiable information can be determined for the user, or a user's geographic location may be generalized where location information is obtained (such as to a city, ZIP code, or state level), so that a particular location of a user cannot be determined. Thus, the user may have control over how information is collected about the user and used by the web server or media server.

Reference throughout this specification to "one embodiment" or "an embodiment" means that a particular feature, structure, or characteristic described in connection with the embodiments included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or."

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

What is claimed is:

1. A method comprising:
    receiving a test configuration data, the test configuration data comprising a seed value and a parameter; and
    generating, by a processing device, a pseudo-random test data stream comprising a plurality of words arranged in a plurality of chunks, wherein a value of each of the plurality of words is based on the seed value, the parameter and an offset of each word within the pseudo-random test data stream, wherein generating the pseudo-random test data stream comprises:
        determining whether a current word of the plurality of words being generated comprises a first word in one of the plurality of chunks; and
        if the current word is the first word in one of the plurality of chunks, setting a value of the current word to a first result of the seed value logically combined with a chunk number of a current chunk in the pseudo-random test data stream and storing the first result as a value of a first previous word.

2. The method of claim 1, wherein values of the words in each of the plurality of chunks are independent of values of the words in any other chunk of the pseudo-random test data stream.

3. The method of claim 2, wherein generating the pseudo-random test data stream further comprises:
    if the current word is not the first word in one of the plurality of chunks, determining whether a least significant bit of the first previous word has a first logical value.

4. The method of claim 3, wherein generating the pseudo-random test data stream further comprises:
    if the least significant bit of the first previous word has the first logical value, shifting bits of the first previous word to the right to create a first shifted word, and setting the value of the current word to a second result of the first shifted word logically combined with the parameter; and
    if the least significant bit of the first previous word has a second logical value, shifting the bits of the first previous word to the right to create a second shifted word, and setting the value of the current word to the second shifted word.

5. The method of claim 4, wherein generating the pseudo-random test data stream further comprises:
    if the least significant bit of the first previous word has the first logical value, storing the second result as a value of a second previous word and setting the value of the current word to a third result of the second result logically combined with a word offset value; and
    if the least significant bit of the first previous word has a second logical value, storing the second shifted word as a value of a third previous word and setting the value of the current word to a fourth result of the second shifted word logically combined with the word offset value.

6. The method of claim 1, wherein the parameter from the test configuration data comprises a compressibility value to control a compressibility of the pseudo-random test data stream.

7. The method of claim 1, wherein the pseudo-random test data stream is generated at a first time, the method further comprising:
    instructing a storage client to write the pseudo-random test data stream to a storage server, the storage server to store the pseudo-random test data stream as a test data file;
    instructing the storage client to read the test data file from the storage server;
    recreating, at a second time subsequent to the first time, the pseudo-random test data stream; and
    comparing the pseudo-random test data stream to the test data file to verify a contents of the test data file.

8. The method of claim 7, wherein the storage client is coupled to the storage server over a network.

9. The method of claim 7, wherein the storage client is directly coupled to the storage server.

10. The method of claim 7, wherein the storage client and the storage server run on a shared test appliance.

11. The method of claim 1, further comprising:
    instructing a storage client on a first appliance to write the pseudo-random test data stream to a storage server on a second appliance over a network, wherein the network comprises a data-transfer efficiency system;
    recreating, at the second appliance, the pseudo-random test data stream; and
    comparing the recreated pseudo-random test data stream to the pseudo-random test data stream to verify an operation of the data-transfer efficiency system.

12. The method of claim 11, further comprising:
    generating a verification report based on a result of the comparing; and
    providing the verification report to a requestor.

13. A computing appliance comprising:
    a memory to store a data verification application; and
    a processing device, coupled to the memory to execute the data verification application, the processing device to:
        receive a test configuration data, the test configuration data comprising a seed value and a parameter; and
        generate a pseudo-random test data stream comprising a plurality of words arranged in a plurality of chunks, wherein a value of each of the plurality of words is based on the seed value, the parameter and an offset of each word within the pseudo-random test data stream, wherein to generate the pseudo-random test data stream, the processing device to:
            determine whether a current word of the plurality of words being generated comprises a first word in one of the plurality of chunks; and if the current word is the first word in one of the plurality of chunks, set a value of the current word to a first result of the seed value logically combined with a chunk number of a current chunk in the pseudo-random test data stream and store the first result as a value of a first previous word.

14. The computing appliance of claim 13, wherein values of the words in each of the plurality of chunks are independent of values of the words in any other chunk of the pseudo-random test data stream.

15. The computing appliance of claim 14, wherein to generate the pseudo-random test data stream, the processing device further to:
if the current word is not the first word in one of the plurality of chunks, determine whether a least significant bit of the first previous word has a first logical value.

16. The computing appliance of claim 15, wherein to generate the pseudo-random test data stream, the processing device further to:
if the least significant bit of the first previous word has the first logical value, shift bits of the first previous word to the right to create a first shifted word, calculate a second result of the first shifted word logically combined with the parameter, store the second result as a value of a second previous word and set the value of the current word to a third result of the second result logically combined with a word offset value; and
if the least significant bit of the first previous word has a second logical value, shift the bits of the first previous word to the right to create a second shifted word, store the second shifted word as a value of a third previous word and set the value of the current word to a fourth result of the second shifted word logically combined with the word offset value.

17. The computing appliance of claim 13, wherein the parameter from the test configuration data comprises a compressibility value to control a compressibility of the pseudo-random test data stream.

18. The computing appliance of claim 13, wherein the pseudo-random test data stream is generated at a first time, and wherein the processing device further to:
instruct a storage client to write the pseudo-random test data stream to a storage server, the storage server to store the pseudo-random test data stream as a test data file;
instruct the storage client to read the test data file from the storage server;
recreate, at a second time subsequent to the first time, the pseudo-random test data stream; and
compare the pseudo-random test data stream to the test data file to verify a contents of the test data file.

19. The computing appliance of claim 18, wherein the storage client is coupled to the storage server over a network.

20. The computing appliance of claim 18, wherein the storage client is directly coupled to the storage server.

21. The computing appliance of claim 18, wherein the storage client and the storage server run on a shared test appliance.

22. The computing appliance of claim 13, wherein the processing device further to:
instruct a storage client on a first appliance to write the pseudo-random test data stream to a storage server on a second appliance over a network, wherein the network comprises a data-transfer efficiency system;
recreate, at the second appliance, the pseudo-random test data stream; and
compare the recreated pseudo-random test data stream to the pseudo-random test data stream to verify an operation of the data-transfer efficiency system.

23. A non-transitory machine-readable storage medium storing instructions which, when executed, cause a processing device to perform operations comprising:
receiving a test configuration data, the test configuration data comprising a seed value and a parameter; and
generating, by the processing device, a pseudo-random test data stream comprising a plurality of words arranged in a plurality of chunks, wherein a value of each of the plurality of words is based on the seed value, the parameter and an offset of each word within the pseudo-random test data stream, wherein generating the pseudo-random test data stream comprises:
determining whether a current word of the plurality of words being generated comprises a first word in one of the plurality of chunks; and
if the current word is the first word in one of the plurality of chunks, setting a value of the current word to a first result of the seed value logically combined with a chunk number of a current chunk in the pseudo-random test data stream and storing the first result as a value of a first previous word.

24. The non-transitory machine-readable storage medium of claim 23, wherein values of the words in each of the plurality of chunks are independent of values of the words in any other chunk of the pseudo-random test data stream.

25. The non-transitory machine-readable storage medium of claim 24, wherein generating the pseudo-random test data stream further comprises:
if the current word is not the first word in one of the plurality of chunks, determining whether a least significant bit of the first previous word has a first logical value.

26. The non-transitory machine-readable storage medium of claim 25, wherein generating the pseudo-random test data stream further comprises:
if the least significant bit of the first previous word has the first logical value, shifting bits of the first previous word to the right to create a first shifted word, calculating a second result of the first shifted word logically combined with a compressibility value, the compressibility value to control a compressibility of the pseudo-random test data stream, storing the second result as a value of a second previous word and setting the value of the current word to a third result of the second result logically combined with a word offset value; and
if the least significant bit of the first previous word has a second logical value, shifting the bits of the first previous word to the right to create a second shifted word, storing the second shifted word as a value of a third previous word and setting the value of the current word to a fourth result of the second shifted word logically combined with the word offset value.

27. The non-transitory machine-readable storage medium of claim 23, wherein the parameter from the test configuration data comprises a compressibility value to control a compressibility of the pseudo-random test data stream.

* * * * *